US006195377B1

United States Patent
Bell et al.

(10) Patent No.: US 6,195,377 B1
(45) Date of Patent: Feb. 27, 2001

(54) EMBEDDED INPUT LOGIC IN A HIGH INPUT IMPEDANCE STROBED CMOS DIFFERENTIAL SENSE AMPLIFIER

(75) Inventors: Shane Lewis Bell, Shrewsbury, MA (US); Bruce Alan Gieseke, San Jose, CA (US)

(73) Assignee: Digital Equipment Corporation, Houston, TX (US)

( * ) Notice: Subject to any disclaimer, the term of this patent is extended or adjusted under 35 U.S.C. 154(b) by 0 days.

(21) Appl. No.: 09/241,212

(22) Filed: Feb. 1, 1999

(51) Int. Cl.[7] ................................................ H03F 3/45
(52) U.S. Cl. ................................ 372/51; 327/52
(58) Field of Search ...................... 327/51, 52, 54, 327/55, 57, 62, 65, 112; 365/205, 207

(56) References Cited

U.S. PATENT DOCUMENTS

| | | | |
|---|---|---|---|
| 4,910,713 | 3/1990 | Madden et al. ..................... | 365/189 |
| 5,528,543 | * 6/1996 | Stiegler ................................ | 368/207 |
| 5,821,799 | * 10/1998 | Saripella ............................. | 327/333 |
| 5,982,203 | * 12/1999 | Pelella ................................ | 327/57 |
| 5,999,033 | * 12/1999 | Keeth et al. ........................ | 327/333 |

OTHER PUBLICATIONS

Chuang, Ching–Te et al., "SOI for Digital CMOS VLSI: Design Considerations and Advances," Proceedings of the IEEE, 86(4) : 689–720 (Apr. 1998).

Glasser, Lance A., and Dobberpuhl, Daniel W., "The Design and Analysis of VLSI Circuits," (MA: Addison_Wesley Publishing), pp. 286–289 (1985).

Matson, M. et al., "A 600MHz Superscalar Floating Point Processor," Paper on EV6 Fbox given at European Solid–State Circuits Conference, (Sep. 1998).

Montanaro, James et al., "A 160–MHZ, 32–b, 0.5–W CMOS RISC Microprocessor," IEEE Journal of Solid–State Circuits, 31(11) 1703–1714 (Nov. 1996).

Jiang, June et al., "High–Performance, Low–Power Design Techniques for Dynamic to Static Logic Interface," Proceedings 1997 International Symposium on Low Power Electronics and Design, Monterey, CA, Aug. 18–20, 1997, pp. 12–17.

* cited by examiner

Primary Examiner—Toan Tran
Assistant Examiner—Hiep Nguyen
(74) Attorney, Agent, or Firm—Hamilton, Brook, Smith & Reynolds, P.C.

(57) ABSTRACT

The present invention provides a sense amplifier that incorporates a logic function. Specifically, that logic function is incorporated into the sense amplifier such that the propagation time of the logic function is avoided and the effective data set-up time of the sense amplifier is reduced. The sense amplifier includes a pair of discharge paths having a true or a complementary version of the logic function associated therewith. When the true or complementary version of the logic function is asserted, one of the discharge paths is turned-on. The output signal that is associated with that discharge path is discharged to a logic low level and the other output signal is pulled to a logic high level. Accordingly, the resulting logic level of the logic function is generated and latched using only the sense amplifier circuit. Therefore, unlike prior art implementations, the data presented to the sense amplifier needs to remain stable for an amount of time that is equivalent to the data set-up timing requirement of the sense amplifier circuit.

55 Claims, 14 Drawing Sheets

EMBEDDED INPUT LOGIC IN A HIGH INPUT IMPEDANCE STROBED CMOS DIFFERENTIAL SENSE AMPLIFIER

BACKGROUND OF THE INVENTION

Generally speaking, computer systems typically include one or more central processor units (CPUs). Each CPU includes many signal paths that convey data between functional units that operate on that data. Such data is typically conveyed using a transfer cycle having a specified timing structure. That timing structure dictates a time period when the data to be transferred will be valid. Accordingly, the data is captured or latched while it is valid and held for a specified amount of time. Such data capture can be performed using a number of edge triggered latches that sense and subsequently latch that data.

Within a CPU, edge triggered latches are commonly implemented using a circuit referred to as a "sense amplifier". Sense amplifiers are designed to sense the logic level of a data signal and to output a steady or latched version of that logic level. Because an edge triggered latch typically samples or "senses" the data on the rising edge of a clock cycle, the above mentioned time period is typically specified with respect to the particular clock cycle during, which the data is valid. The data is latched, i.e. held at the output of the sense amplifier, until the falling edge of that clock cycle or until the rising edge of the next clock cycle, depending upon its design. After that data has been latched, new data can be asserted on the signal line without affecting the latched data.

An ideal sense amplifier would latch the data immediately upon the rising edge of the associated clock cycle. In practice, however, the latching operation occurs over a finite amount of time during which the data must remain stable. That finite amount of time is defined by "data set-up" and "data hold" timing requirements. Accordingly, the data signal presented to the sense amplifier must satisfy the data set-up and data hold timing requirements in order for the associated logic levels to be properly latched.

The data set-up timing requirement refers to the amount of time that the data must remain stable before the sense amplifier latches it. The data set-up time is typically specified in relation to the rising edge of the above mentioned clock cycle during which the data is valid. The data hold timing requirement refers to the amount of time that the data signal must remain stable after the rising edge of that same clock cycle.

Logic circuits are typically connected in series with such sense amplifiers so that associated logic functions can be performed on the incoming data before it is latched. For example, before being input to a sense amplifier, a pair of data signals may be logically "Anded". The product of those data signals is then conveyed to the sense amplifier which responsively senses the product and generates a corresponding latched output signal. The circuits that implement such logic functions impose a time delay, referred to as the "propagation delay," that is measured from the time when the data signals are imposed on the circuit until the product is generated. The propagation delay defers the point in the data cycle when the data is received by the sense amplifier and thus defers the point when the latching operation can be initiated. Therefore, in order for the data to satisfy the set-up and hold timing requirements of the sense amplifier, the data needs to remain valid at the input of the logic function for a time period that is at least as long as the combination of the propagation delay of the logic circuit and the set-up and hold timing requirements of the sense amplifier.

SUMMARY OF THE INVENTION

The data set-up timing requirement of prior art sense amplifiers is effectively increased by the propagation delay of the logic circuits that are connected in series therewith. In other words, data that is to be operated on by the logic circuit, and subsequently latched by the sense amplifier, must be held stable for a substantially longer time than data that is directly input to the sense amplifier. Therefore, the data set-up timing requirement of the sense amplifier is effectively increased by the propagation time of the logic circuit, thereby reducing the performance of that sense amplifier.

Accordingly, a method and apparatus are provided for improving the effective data set-up timing requirement of the sense amplifier. Specifically, the logic function is incorporated into the sense amplifier such that the propagation time of the logic function is avoided and the effective data set-up time of the sense amplifier is reduced.

In accordance with an embodiment of the present invention, a method and apparatus is provided for imposing a logic function on a plurality of data signals, as part of the latching operation. The sense amplifier achieves that result by discharging an internal signal through a first discharge path when a first logic function is asserted. That logic function is included as an integral portion of the discharge path rather than as a separate logic circuit. Also, another internal signal is discharged through a second discharge path when a second logic function, included as an integral portion of that discharge path, is asserted. The second logic function is asserted in response to a generated representation of the data signals.

When the representation is a buffered representation, the logic function associated with the second discharge path is the logical inversion of the logic function associated with the first discharge path. Accordingly, the logic functions are asserted and de-asserted at complementary times. For example, the logic function associated with the second discharge path may be a logical NAND, NOR or XNOR function when the logic function associated with the first discharge path is a logical AND, OR or XOR function, respectively.

When the representation is an inverted representation, the combination of that inversion with the logic function associated with the second discharge path, performs the complementary logic function to the logic function associated with the first discharge path. For example, that logic function may be implemented as a logical NAND, NOR or XNOR function when the logic function associated with the first discharge path is a logical AND, OR, or XOR function, respectively. In other words, the logic function that is associated with the second discharge path is asserted when the logic function associated with the first discharge path is deasserted, and vice versa.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Generally, the sense amplifier of the present invention provides significantly increased performance due to a considerable reduction of the data set-up timing requirement. Such a reduction is performed by incorporating logic functions into the sense amplifier that, in the prior art, are performed outside of the sense amplifier. By reducing the data set-up timing requirement, the performance of the sense amplifier is improved since it can be operated at an increased clock frequency. Accordingly, data can be presented to the sense amplifier at an increased rate.

I. A Computer System

Figure 1:
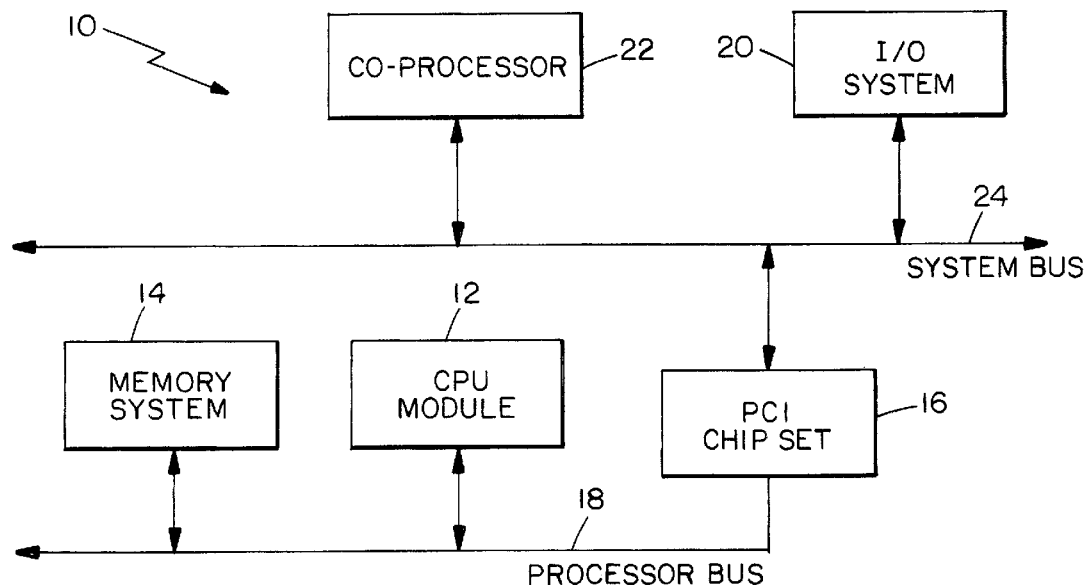
FIG. 1 is a schematic drawing of a computer system including a central processing module in which the present invention can be used.

FIG. 1 is a schematic diagram of a computer system 10 that includes a central processing unit (CPU) module 12, a memory system 14 and a PCI chip set 16 connected by a processor bus 18. The PCI chip set 16 is further connected to an I/O system 20 and a co-processor module 22 by a system bus 24. Central processing module 12 can include a number of sense amplifiers for use with low voltage swing signals according to the present invention.

Figure 2:
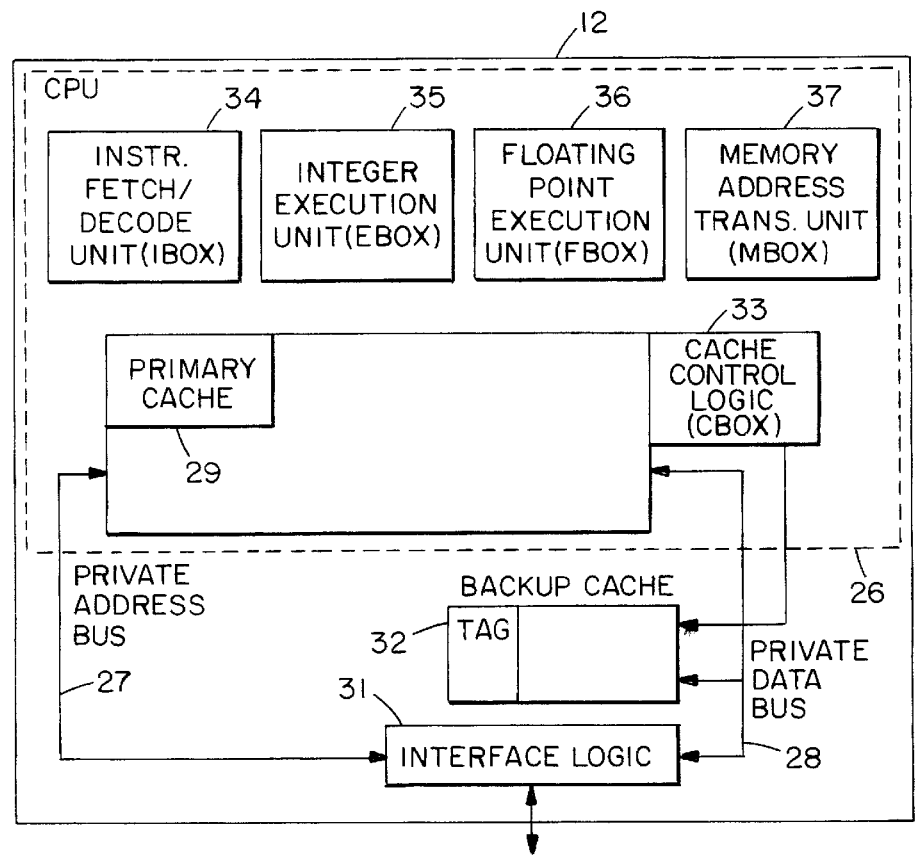
FIG. 2 is a schematic diagram of the central processing module of FIG. 1.

Referring now to FIG. 2, central processing module 12 is shown to include a CPU 26. A private address bus 27 and a private data bus 28 within CPU 26 connects a primary cache 29 and a system bus interface 31. The private data bus 28 connects the CPU 26 to a backup cache (Bcache) 32 that, along with the primary cache 29, is controlled by the Cache Control and Bus Interface unit 33.

CPU 26 further includes several logic circuits that enable it to perform the major operations that the computer system 10 requires. The Ibox 34, or Instruction Fetch and Decode Unit, controls instruction prefetching, instruction decoding, branch prediction, instruction issuance, and interrupt handling. The Ebox 35, or Integer Execution Unit, handles the functions of addition, shifting, byte manipulation, logic operations, and multiplication for integer values stored in the system. These same operations, for floating point values, are controlled by the Fbox 36, or Floating Point Execution Unit. The Mbox 37, or Memory Address Translation Unit, translates virtual addresses, generated by programs running on the system, into physical addresses which are used to access locations in the computer system. Lastly, the Cbox 33, or Cache Control and Bus Interface Unit, controls the primary cache 29 and backup cache 32. It also controls the private data bus, private address bus, memory related external interface functions, and all accesses initiated by the Mbox 37.

Each of the circuits mentioned above include sense amplifiers to detect and latch logic levels of transferred data signals. Accordingly, sense amplifiers or edge-triggered latches are widely used in many different areas of CPU module 12. In order to increase the data transfer speed, the speeds of the sense amplifiers must also be increased.

II. An Inventive Sense Amplifier

Figure 3:
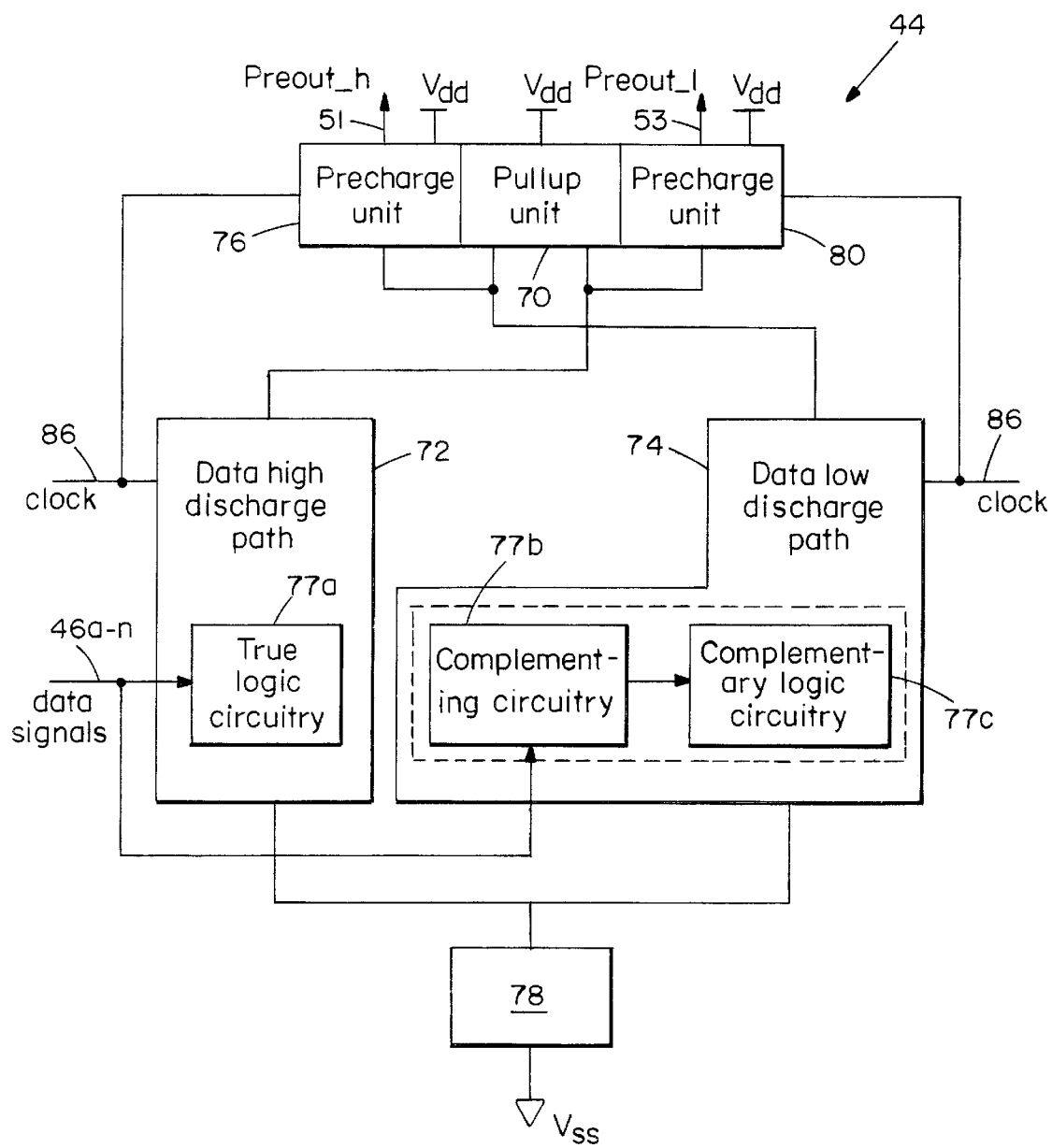
FIG. 3 is a functional block diagram of a sense amplifier that can be practiced in the central processing module of FIG. 2, according to the present invention.

Referring now to FIG. 3, a functional block diagram of sense amplifier 44 is shown to include a pair of discharge paths 72 and 74. Discharge path 72 includes a logic function referred to as the true logic circuitry 77a. Discharge path 74 includes logic functions implemented within complementing circuitry 77b and complementary logic circuitry 77c. Depending upon which of those logic functions are asserted, the corresponding discharge path 72 or 74 will be turned-on. Only one discharge path, 72 or 74, can be turned-on at a given time. When a discharge path 72 or 74 is turned-on, it provides an electrical path through which the associated output signal line (preout_h 51 or preout_l 53) can discharge. Responsively, output signal preout_h 51 will develop a latched version of the assertion level of true logic circuitry 77a. Also, output signal preout_l 53 will develop a latched version of the complementary assertion level.

For example, consider that logic circuitry 77a implements a logical AND function. Discharge path 72 is turned-on when the logical AND of the input data signals produces a "true" result. Conversely, discharge path 74 is turned-on, and discharge path 72 is turned-off, when the logical NAND of the input data signals (as implemented by the combination of complementing circuitry 72b and complementary logic circuitry 77c) results in a "true" result. Therefore, the combination of complementing circuitry 77b and complementary logic circuitry 77c implements the complementary logic function to true logic circuitry 77a.

The combination of complementing circuitry 77b and complementary logic circuitry 77c can be implemented in several ways. First, complementing circuitry 77b can buffer data signals 46 and convey the result to complementary logic circuitry 77c. (It should be noted that buffering of the data signals can be accomplished by not manipulations them or, in other words, simply passing them through complementing circuitry 77c.) Therefore, complementary logic circuitry 77c will implement the logical complement of the logic function of true logic circuitry 77a. For example, where true logic circuitry 77a implements a logical AND function, complementary logic circuitry 77c will implement a logical NAND function. Therefore, a given arrangement of data signals 46 will result in true logic circuitry 77a being asserted and complementary logic circuit 77c being de-asserted, or vice versa.

Alternatively, complementing circuitry 77b can implement the logical complement of true logic circuitry 77a. With such an implementation, complementary logic circuitry 77c is asserted or de-asserted at the same time as complementing circuitry 77b. For example, where true logic circuitry 77a implements a logical AND function, complementing circuitry 77b will implement a logical NAND function. The result of that NAND function is conveyed to complementary logic circuitry 77c that mirrors the assertion level of complementing circuitry 77b.

Further, complementing circuitry 77b can perform an inversion operation on data signals 46. Accordingly, complementary logic circuitry 77c implements a logic function according to DeMorgan's theorem. DeMorgan's theorem specifies the following, relationships:

$$\overline{a \text{ AND } b} = \overline{a} \text{ OR } \overline{b} \quad (1)$$

$$\overline{a \text{ OR } b} = \overline{a} \text{ AND } \overline{b} \quad (2)$$

For example, where true logic circuitry 77a implements a logical AND function, the combination of complementing circuitry 77b and complementary logic circuitry 77c should implement a logical NAND function. Therefore, since data signals 46 are inverted by complementing circuit 77b, complementary logic circuitry 77c implements a logical OR function of the inverted data signals 46 such that the resulting combination persons a logical NAND function.

Sense amplifier 44 also includes pre-charge units 76 and 80 that are used for initializing or "pre-charging," the internal nodes of sense amplifier 44 to predetermined logic levels. The pre-charge units are connected to a clock signal 86 and pre-charge the internal nodes of the sense amplifier when that clock signal 86 transitions to a logic low level. Alternatively, when clock signal 86 transitions to a logic high level, the pre-charge units are turned-off and evaluate circuit 78 is turned-on. Evaluate circuit 78 allows current to flow from either the data low discharge path 74 or from the data high discharge path 72, depending upon which one is turned-on, to Vss. Accordingly, the associated output signal, preout_h 51 or preout_l 53, will be discharged.

A voltage level corresponding to the assertion level of true logic circuitry 77a is developed on signal preout_h 51. Also, the complementary voltage level is developed on signal preout_l 53. With such a structure, the data set-up timing requirement of sense amplifier 44 is significantly less than an embodiment where the logic function and sense amplifier are implemented as separate circuits. In other words, the data set-up timing requirement is reduced by an amount approaching the propagation delay of the circuit that would otherwise have implemented the logic function outside of the sense amplifier.

Figure 15:
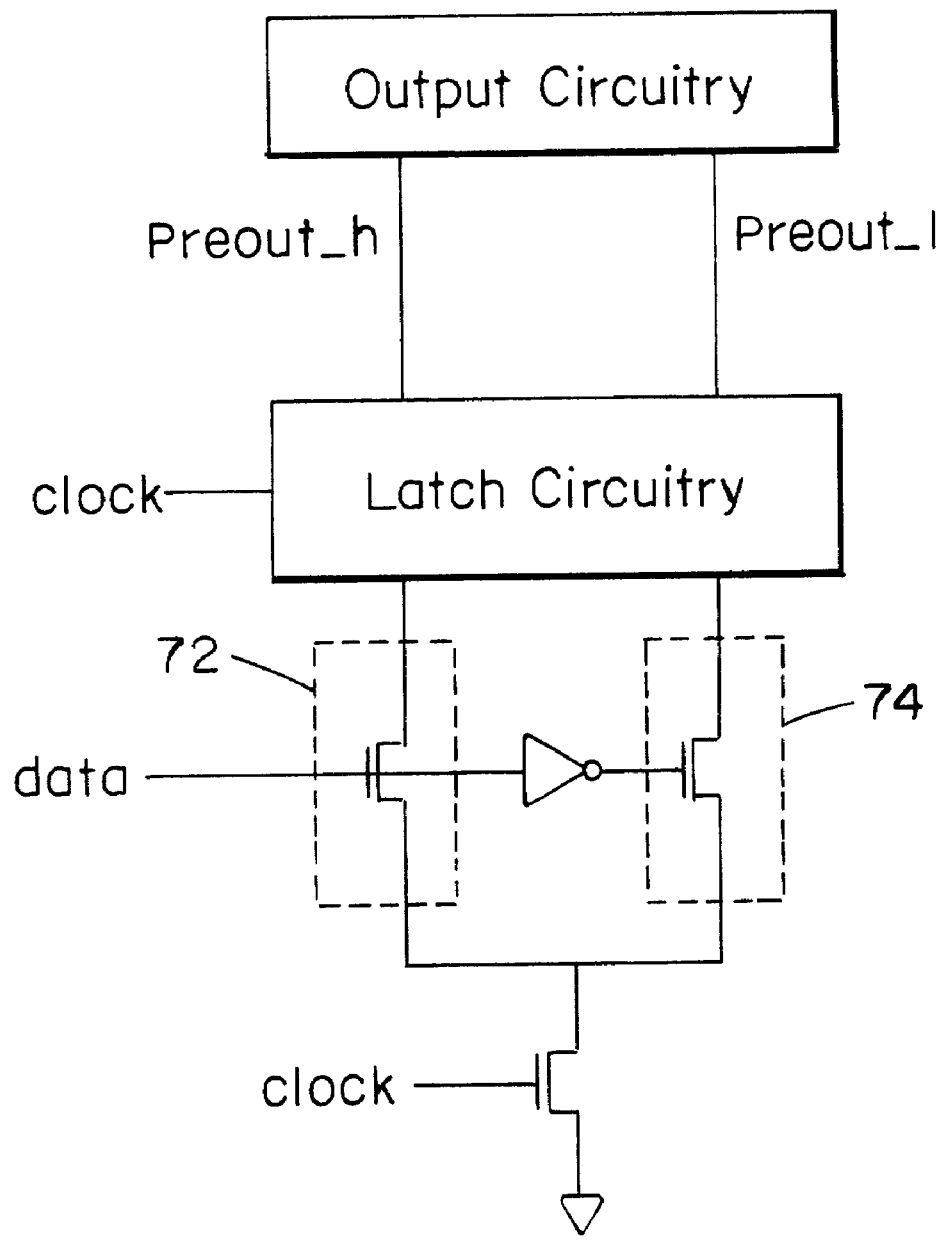
FIG. 15 is a schematic diagram of a prior art sense amplifier.

Referring briefly to the prior art circuit depicted in FIG. 15, an inverter is connected between the two discharge paths 72 and 74. The propagation delay associated with that inverter is similar to the propagation delay imposed by complementing circuitry 77b. Accordingly, the addition of complementing circuitry 77b does not add additional delay time to the sense amplifier. Therefore, it can more clearly be seen that the data set-up timing requirement of such a sense amplifier is reduced by an amount approaching the propagation delay of a circuit that would otherwise have implemented a logic function outside of the sense amplifier.

Figure 4:
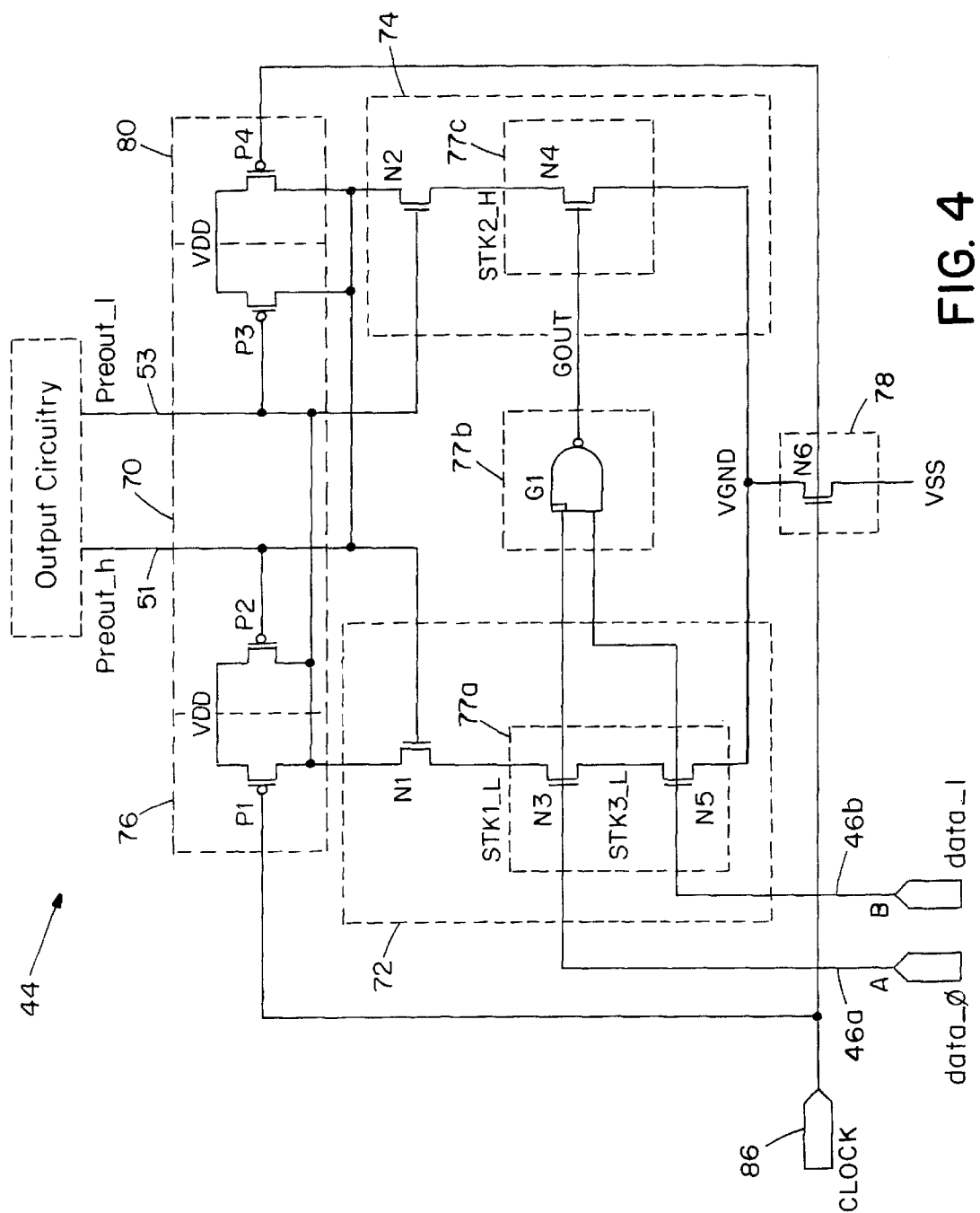
FIG. 4 is a schematic diagram of an embodiment (an AND/NAND latch) of the sense amplifier of FIG. 3, according to the present invention.

Referring now to FIG. 4, a schematic diagram of a sense amplifier 44 that imposes a logical And function on data signals 46 is shown, such a sense amplifier is referred to as an "AND/NAND Latch". Data signals 46a and 46b are connected to true logic circuitry 77a, i.e. to NMOS transistors N3 and N5, respectively. NMOS transistors N3 and N5 are connected in series such that they implement a logical AND function within the data high discharge path 72. In other words, current can only flow through transistors N3 and N5 when data signals 46a and 46b are both at logic high levels. In that state, discharge path 72 is referred to as being "turned-on". Likewise, complementing circuitry 77b also receives data signals 46a and 46b. Complementing circuitry 77b generates a representation of data signals 46a and 46b by imposing a logical NAND function (G1) on them. The output of logical NAND function G1 is conveyed to transistor N4, which composes complementary logic circuitry 77c.

Generally, when data signals 46a and 46b develop logic high levels, transistors N3 and N5 are both turned-on. Accordingly, when evaluate transistor N6 is turned-on, in response to an assertion of clock signal 86, the data high discharge path 72 discharges signal preout_l 53 to Vss. At the same time, transistor N4 remains turned-off in response to the logic low level output by NAND function G1. Therefore, signal preout_h 51 cannot discharge and remains at a logic high level that corresponds to the logical AND function imposed on data signals 46a and 46b.

The opposite result occurs when at least one of the data signals, 46a or 46b, develops a logic low level. In other words, when at least one of the transistors N3 or N5 is turned-off. Transistor N4 is turned-on since NAND gate G1 generates a logic high level in response to at least one of the data signals developing a logic low level. Accordingly when evaluate transistor N6 is turned-on, the data low discharge path 74 discharges signal preout_h 51 to Vss. Because data high discharge path 72 remains turned-off, signal preout_l 53 cannot discharge and remains at a logic high level. Therefore, signal preout_h 51 represents the output of the logical AND function imposed on data signals 46 while signal preout_l 53 represents the output of the logical NAND function imposed on data signals 46.

IV. Pre-Charge Operation

Figure 5:
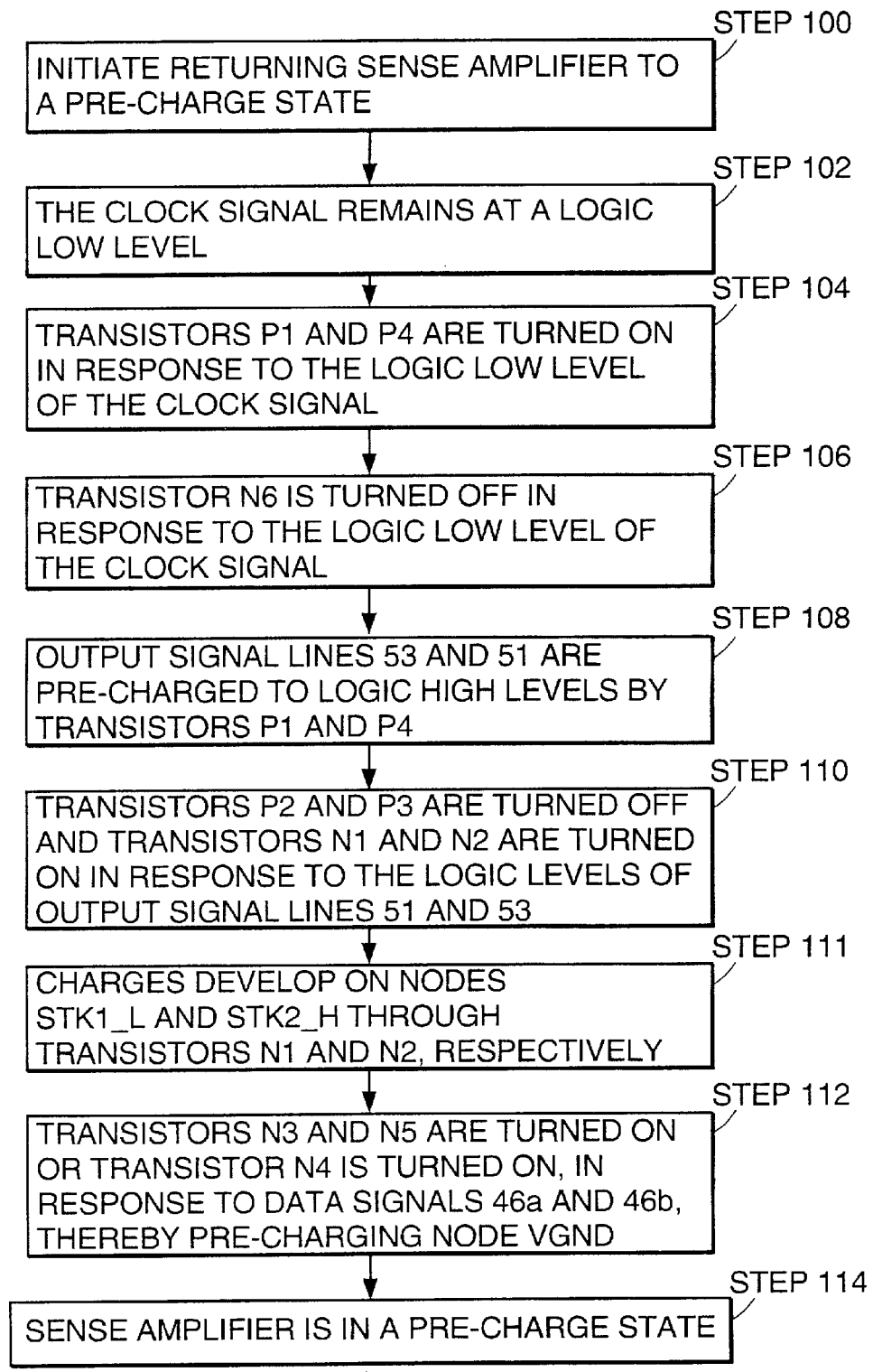
FIG. 5 is a flow diagram of the pre-charge operation of the sense amplifier of FIG. 4.

Referring now to the flow diagram of FIG. 5, the pre-charge operation of sense amplifier 44 will be described. The pre-charge operation is initiated between sense operations such that the internal nodes (preout_h 51, preout_l 53, STK1_L, STK2_H, STK3_l. and VGND) are reset to logic high levels (Step 100).

During such a pre-charge operation, the clock signal 86 remains at a logic low level (Step 102). The clock signal 86 conveys the logic low level to the gates of PMOS transistors P1 and P4, turning them "on" or, in other words, allowing current to flow from their source terminals to their drain terminals (Step 104). Also, NMOS evaluate transistor N6 is turned "off" in response to clock signal 86 (Step 106). It should be noted that NMOS evaluate transistor N6 is only turned-on during the sensing or latching operation.

When transistors P1 and P4 are turned-on, signal lines preout_h 51 and preout_l 53 are charged to approximately the same voltage as Vdd. Output signal lines 51 and 53 are thereby pre-charged to logic high levels (Step 108). The logic high levels on signals preout_h 51 and preout$_{hd}$ _l 53 are conveyed to the gate terminals of PMOS transistors P2 and P3, which are responsively turned-off, and to the gate terminals of NMOS transistors N1 and N2, which are turned-on (Step 110). When transistors N1 and N2 are turned-on, charge is developed on nodes STK1_L and STK2_H (Step 111).

Further, because transistors N3 and N5, or transistor N4 will be turned 'on' in response data signals 46a and 46b (Step 112), node VGND is pre-charged to a logic high level and sense amplifier 44 is referred to as being in a pre-charged state (Step 114).

V. Sense Amplifier Operation Responsive to the Data Signals Transitioning to Logic High Levels Referring now to the flow diagram of FIG. 6, the operation of sense amplifier 44 will be described in response to data signals 46a and 46b maintaining logic high levels during the data valid portion of the above mentioned data cycle. Accordingly, data signals 46a and 46b develop logic high levels at a predetermined time before clock signal 86 transitions to a logic high level (Step 118). Those logic high levels are conveyed to the gate terminals of NMOS transistors N3 and N5, turning them on (Step 120). The logic high levels of data signals 46a and 46b are also conveyed to NAND gate G1 (Step 122). NAND gate G1 responsively outputs a logic low level that is conveyed to the gate terminal of NMOS transistor N4 (Step 123).

Subsequently, clock signal 86 transitions to a logic high level (Step 124). That logic high level is conveyed to PMOS transistors P1 and P4, turning them off. The clock signal 86 is also conveyed to NMOS evaluate transistor N6, simultaneously turning it on (Step 126). Because NMOS transistor N6 has its source terminal connected to Vss, node VGND begins to discharge to a logic low level through transistor N6 (Step 128).

At that point in the sense operation, each transistor (N1, N3 and N5) in the data high discharge path 72 is turned-on. Accordingly, an electrical path is provided from signal preout_l 53 to Vss (Step 130), through which signal preout_l 53 begins to discharge (Step 132). Conversely, transistor N4, in the data low discharge path 74, is turned-off. Therefore, signal preout_h 51 cannot discharge and remains approximately at its pre-charged level, i.e. at a logic high level (Step 134).

When signal preout_l 53 reaches a logic low level, it is conveyed to the gate terminal of transistor N2, which is responsively turned-off, and to the gate terminal of transistor P3, which is responsively turned-on (Step 136). When transistor P3 is turned-on, it raises signal preout_h 51 and the gate terminal of transistor N1 to approximately the Vdd voltage level, thereby strongly turning transistor N1 on and further increasing the rate that signal preout_l 53 is discharged (Step 138). Once signals preout_h 51 and preout_l 53 reach their respective voltages, subsequent changes to data signals 46a and 46b will not affect them until after clock signal 86 has again transitioned to a logic low level and subsequently begins to transition to a logic high level (Step 140).

VI. Sense Amplifier Operation Responsive to at Least One Data Signal Transitioning to a Logic Low Level Referring now to the flow diagram of FIG. 7, the operation of sense amplifier 44 will be described in response to data signal 46a transitioning from a logic high level (its pre-charged level) to a logic low level. For illustration purposes, consider that sense amplifier 44 has been returned to the pre-charged state in the manner previously described (see FIG. 6) (Step 114). When sense amplifier 44 is in such a pre-charge state, the input clock signal 86 is at a logic low level.

Accordingly, data signal 46a transitions to a voltage level that reflects a logic low level, at a predetermined time before clock signal 86 transitions to a logic high level (Step 150). That logic low level is conveyed to the gate terminal of NMOS transistor N3, turning it off, and the logic high level of data signal 46b is conveyed to the gate terminal of NMOS transistor N5, turning it on (Step 152). The logic levels of data signals 46a and 46b are also conveyed to NAND gate G1 (Step 154). NAND gate G1 responsively outputs a logic high level that is conveyed to the gate terminal of NMOS transistor N4, turning it on (Step 156).

Subsequently, clock signal 86 transitions to a logic high level (Step 158). That logic high level is conveyed to PMOS transistors P1 and P4, turning them off (Step 160). Clock signal 86 is also conveyed to NMOS evaluate transistor N6, simultaneously turning it on (Step 162). Responsively, node VGND begins to discharge to a logic low level (Step 164).

At that point in the sense operation, signal preout_l 53 cannot discharge through data high discharge path 72 since transistor N3 remains turned-off (Step 166). Therefore, signal preout_l 53 remains at its pre-charged level, i.e. at a logic high level (Step 168). Conversely, transistors N2 and N4 in the data low discharge path 74 are tuned-on (Step 170). Accordingly, data low discharge path 74 provides an electrical path from signal preout_h 51 to Vss, through which signal preout_h 51 begins to discharge (Step 172).

When signal preout_h 51 reaches a logic low level, it is conveyed to the gate terminal of transistor N1 which is responsively turned-off, and to the gate terminal of transistor P2 which is responsively turned-on (Step 174). When transistor P2 is turned on, it raises signal preout_l 53, and the gate terminal of transistor N2, to approximately the Vdd voltage level, thereby strongly turning transistor N1 on and further increasing the rate that signal preout_h 51 is discharged (Step 176).

Figure 6:
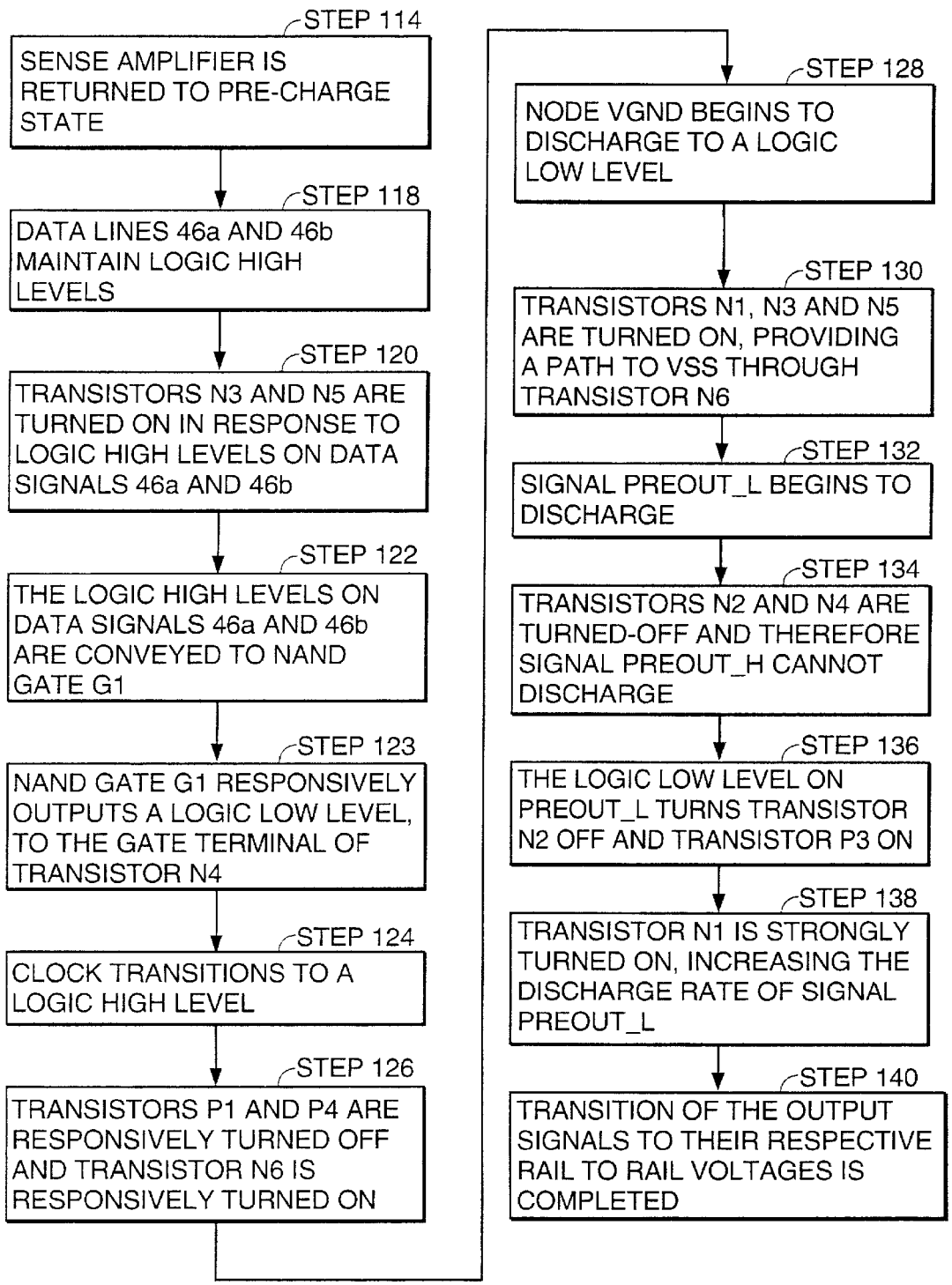
FIG. 6 is a flow diagram of the operation of the sense amplifier of FIG. 4.
Figure 7:
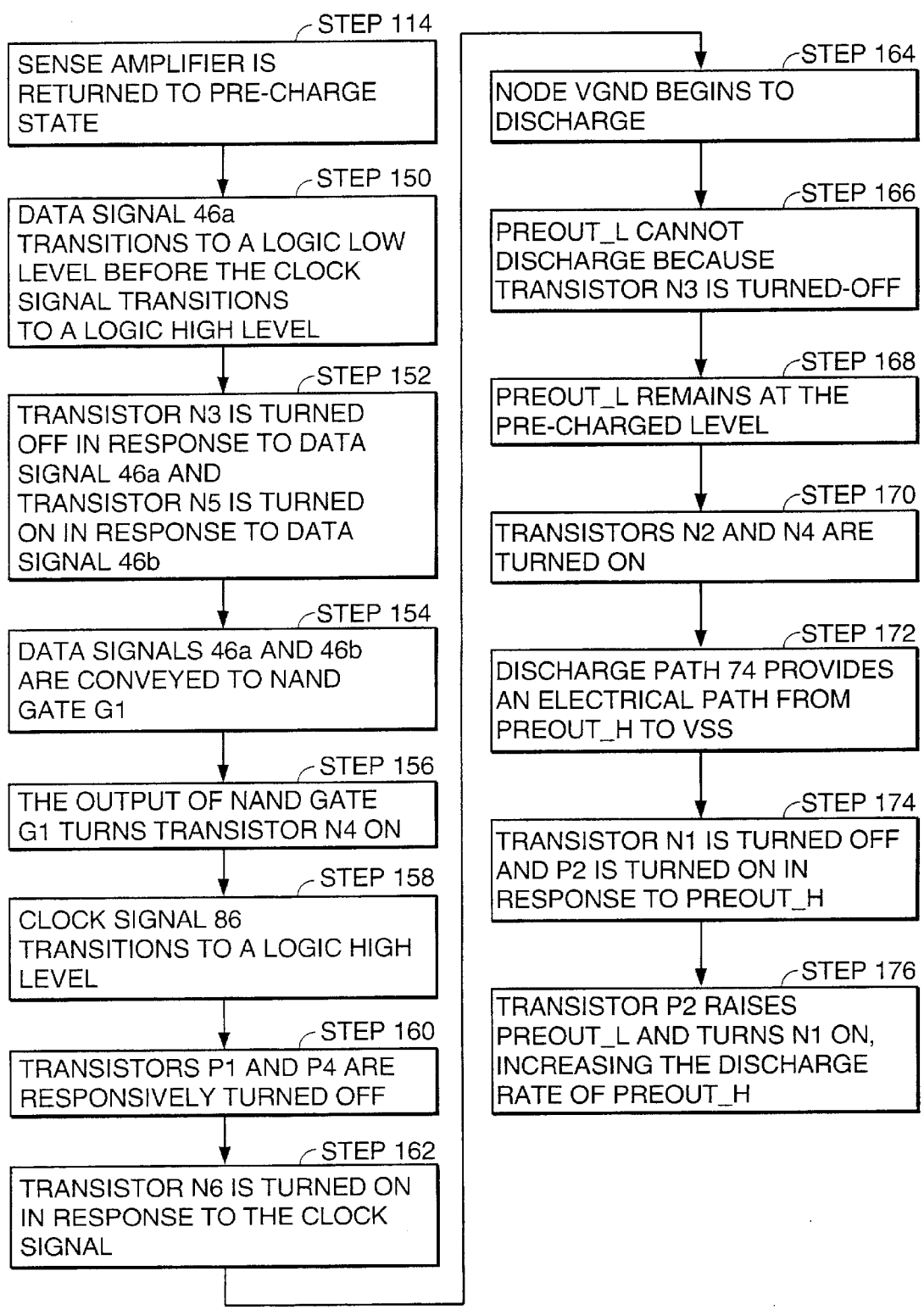
FIG. 7 is a flow diagram of a further operation of the sense amplifier of FIG. 4.
Figure 8:
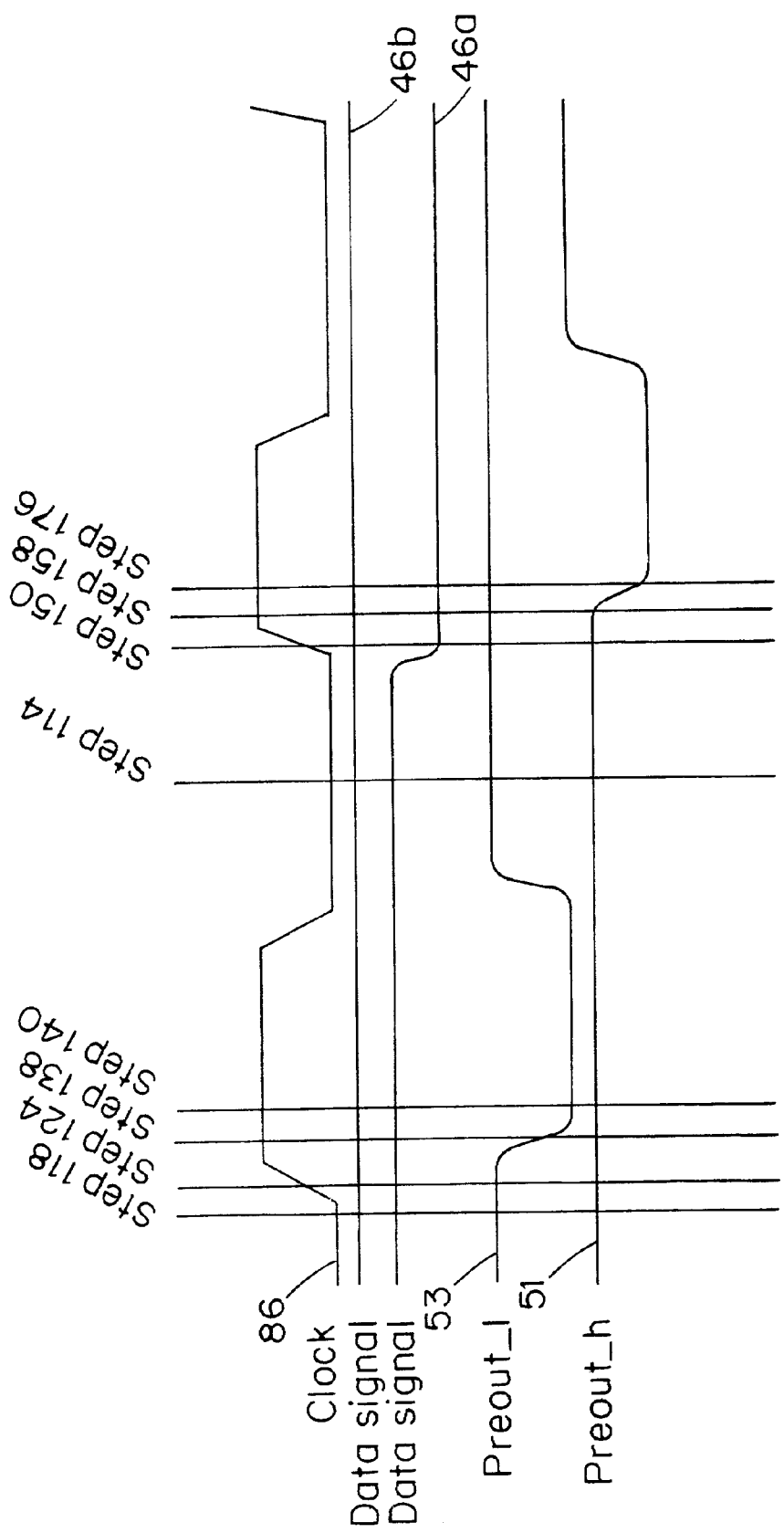
FIG. 8 is a timing diagram of the operation of the sense amplifier of FIG. 4.

Referring briefly to the timing diagram of FIG. 8, the timing waveforms of signals clock 86, data signal 46a, data signal 46b, preout_l 53 and preout_h 51 are shown in relation to the corresponding operational steps of FIGS. 6 and 7.

It will be recognized by one of ordinary skill in the art that the functionality of the inventive sense amplifier will be preserved if the NMOS and PMOS transistors are exchanged, along with the polarity of the associated logic signals. Further, the sense amplifier of the present invention is not limited to the present implementation. To the contrary, the instant sense amplifier can implement a variety of logic functions imposed on the data signals 46, as will be described.

VII. Alternative Embodiments of the Present Invention

Figure 9:
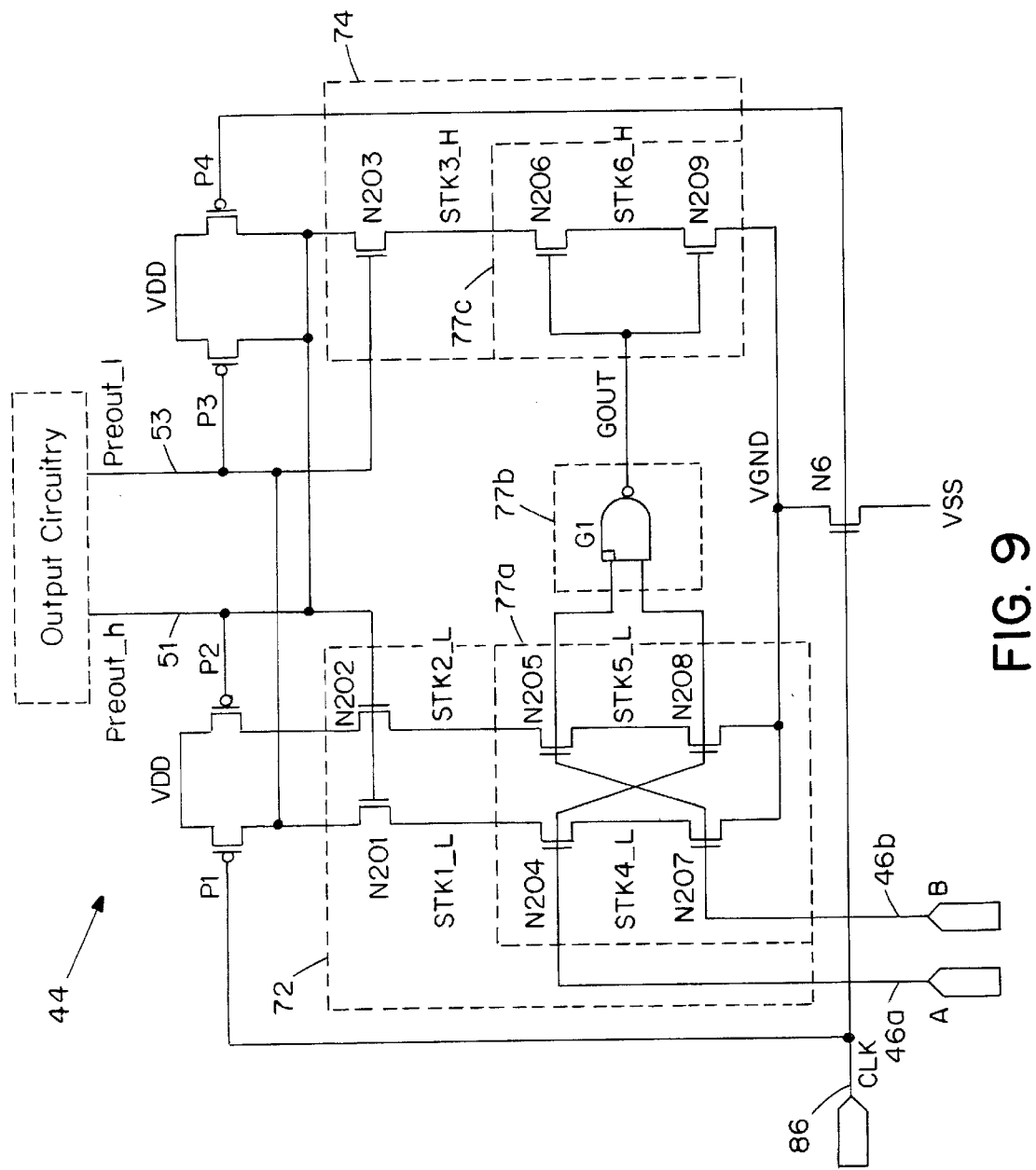
FIG. 9 is a schematic diagram of a further AND/NAND latch embodiment of the sense amplifier of FIG. 3, according to the present invention.

Referring now to FIG. 9, an alternative embodiment of sense amplifier 44 is shown that implements an AND/NAND latch having crossed-input balanced stacks. As in the AND/NAND latch shown in FIG. 4, the data high discharge path 72 is only turned-on when data signals 46a and 46b are both at logic high levels. Accordingly, true logic circuitry 77a is implemented with two pairs (N204/N203 and N205/N208) of serially connected transistors. Also complementing circuitry 77b is implemented by NAND gate G1 and complementary logic circuit 77c is implemented by a pair of serially connected transistors, N206 and N209, having common gate terminal connections such that they are turned on at the same time.

When data signals 46a and 46b are both at logic high levels, signal preout_h 53 discharges through data high discharge path 72 (i.e., through transistors N201, N202, N204, N205, N207 and N208) and evaluate transistor N6, to Vss. Signal preout_h 51 cannot discharge through data low discharge path 74 since data signals 46a and 46b cause NAND gate G1 to output a logic low level that turns transistors N206 and N209 off. Accordingly, signal preout_l 53 transitions to a logic low level and signal preout_h 51 remains at a logic high level. Signal preout_h 51 therefore reflects the AND function of data signals 46a and 46b.

Alternatively, when at least one of the data signals 46a or 46b is at a logic low level, transistors N203, N206 and N209 are turned-on, thereby discharging signal preout_h 51 to Vss through evaluate transistor N6. Signal preout_l 53 is prevented from discharging since at least one transistor in each portion of data high discharge path 72 is turned-off. Accordingly, signal preout_h 51 transitions to a logic low level and signal preout_l 53 remains at a logic high level. Signal preout_h 51 therefore reflects the logical AND function of data signals 46a and 46b. Signal preout_l 53 reflects the complementary logic level to signal preout_h 51, i.e., the NAND function of data signals 46a and 46b.

Figure 10:
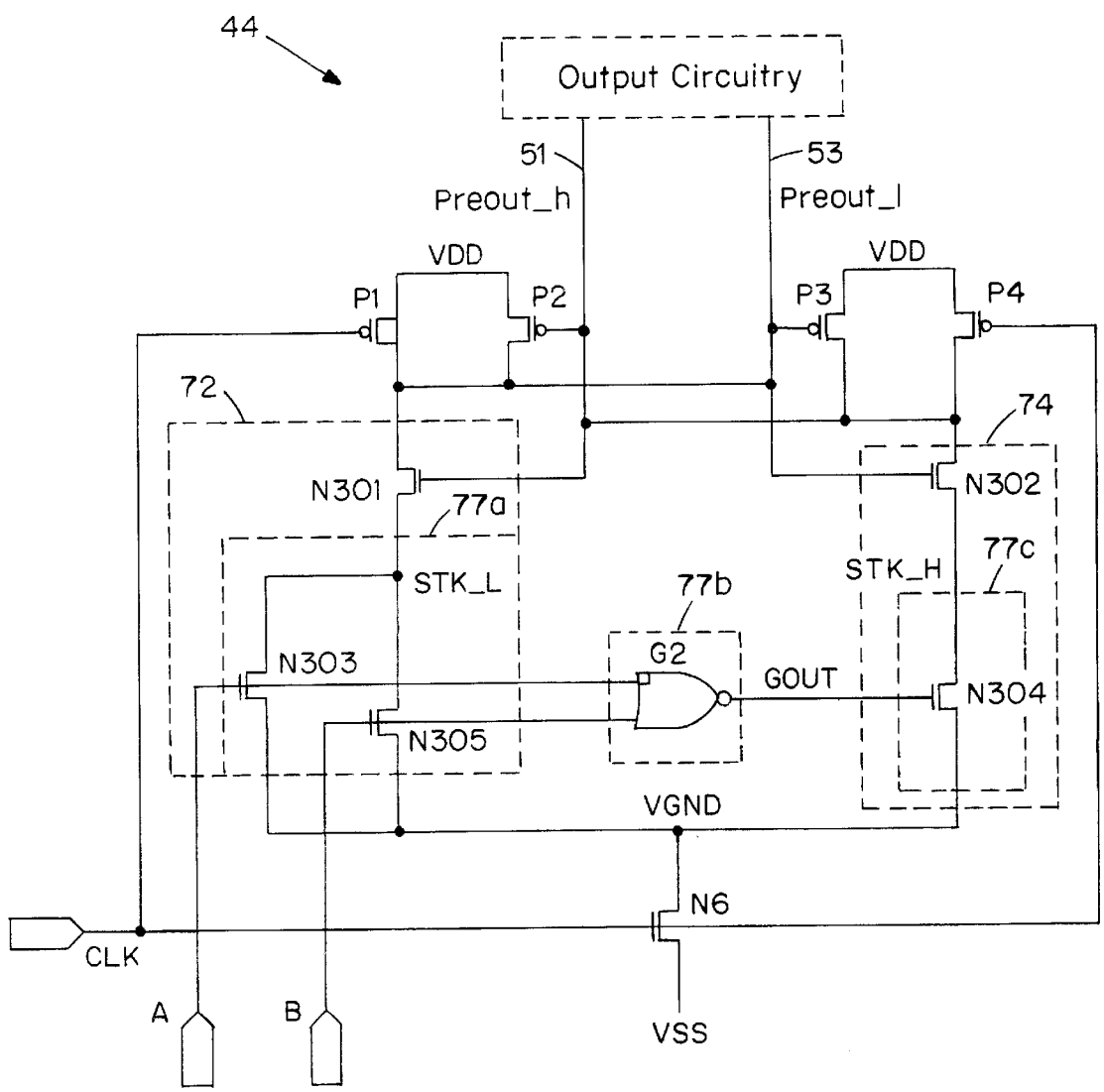
FIG. 10 is a schematic diagram of an OR/NOR embodiment of the sense amplifier of FIG. 3, according to the present invention.

Referring now to FIG. 10, a still further embodiment of sense amplifier 44 is shown to include a circuit configuration that performs a logical OR function on data signals 46a and 46b, and latches the result. Such an embodiment is referred to as an "OR/NOR Latch".

In the present embodiment, true logic circuitry 77a is shown to include a pair of transistors N303 and N305, connected in parallel. Accordingly, when at least one of the data signals 46a or 46b develop a logic high level, data high discharge path 72 is turned on. Also the complementing circuitry 77b is implemented by NOR gate G2 and the complementary logic 77c is implemented by a single NMOS transistor N304.

When at least one of the data signals 46a or 46b develop a logic high level, signal preout_l 53 discharges through data high discharge path 72 (i.e., through transistors N301 and N303, or N305) and evaluate transistor N6 to Vss. Signal preout_h 51 cannot discharge since data signals 46a and 46b cause NOR gate G2 to turn transistor N304 off. Accordingly, signal preout_l 53 transitions to a logic low level and signal preout_h 51 remains at a logic high level. Signal preout_h 51 therefore reflects the logical OR function of data signals 46a and 46b.

Alternatively, when both of the data signals 46a and 46b are at logic low levels, transistors N303 and N305 are turned-off and transistor N304 is turned-on. Therefore, signal preout_h 51 is discharged to Vss through data low discharge path 74 (i.e., through transistors N302 and N304) and evaluate transistor N6. Signal preout_l 53 is prevented from discharging though data high discharge path 72 since transistors N303 and N305 are each turned-off. Accordingly, signal preout_h 51 transitions to a logic low level and signal preout_l 53 remains at a logic high level. Signal preout_h 51 therefore reflects the logical OR function of data signals 46a and 46b. Signal preout_l 53 reflects the complementary logic level to signal preout_h 51, i.e., the logical NOR function of data signals 46a and 46b.

Figure 11:
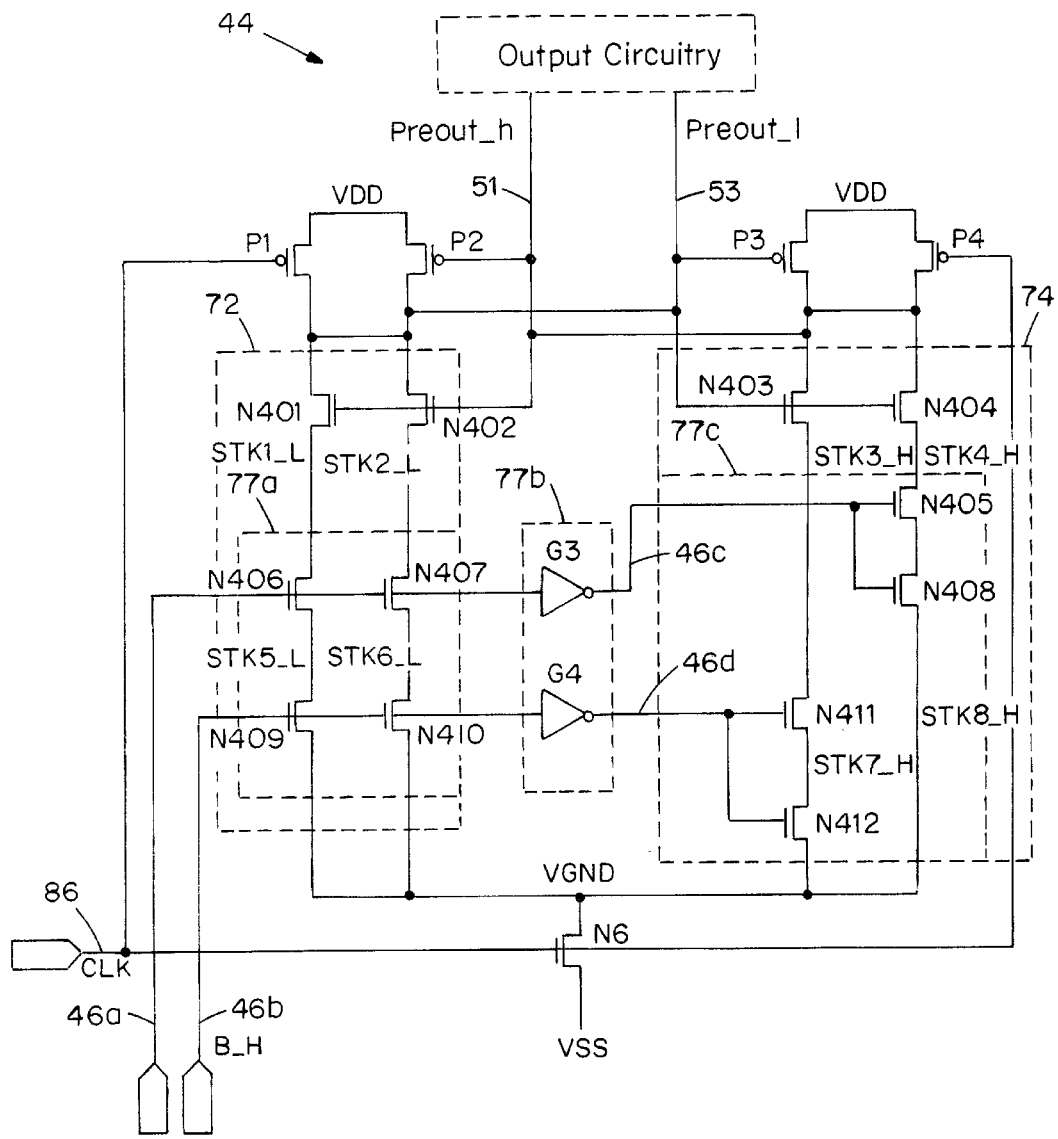
FIG. 11 is a schematic diagram of a further AND/NAND latch embodiment of the sense amplifier of FIG. 3, according to the present invention.

Referring now to FIG. 11, an alternative embodiment of sense amplifier 44 is shown to implement a further AND/NAND latch configuration. In the present embodiment, the complementing circuitry 77b comprises inverters G3 and G4. Those inverters invert data signals 46a and 46b before they are conveyed to complementary logic circuit 77c. The combination of complementing logic 77b and complementary logic circuitry 77c provides a logic NAND function of data signals 46a and 46b. In other words, data low discharge path 74 is turned-on when the NAND function of data signals 46a and 46b would be a "true" or logic high level.

The data high discharge path 72 is only turned-on when data signals 46a and 46b are both at logic high levels. Accordingly, true logic circuitry 77a is implemented with two pairs of serially connected transistors N406/N409 and N407/N410. Each of those transistors must be turned-on before signal preout_l 53 can be discharged through data high discharge path 72. More specifically, when data signals 46a and 46b are both at logic high levels, signal preout_l 53 discharges through transistors N401, N402, N406, N407, N409 and N410 and evaluate transistor N6, to Vss. Signal preout_h 51 cannot discharge since data signals 46a and 46b cause inverters G3 and G4 to generate logic low levels. Responsively, transistors N411/N412 and N405/N408 are turned-off. Accordingly, signal preout_l 53 discharges to a logic low level and signal preout_h 51 remains at a logic high level. Signal preout_h 51 therefore reflects the logical AND function of data signals 46a and 46b.

Alternatively, when at least one of the data signals 46a or 46b develops a logic low level, transistor pairs N411/N412 and/or N405/N408 are turned-on, thereby discharging signal preout_h 51 to Vss through evaluate transistor N6. Signal preout_l 53 is prevented from discharging since at least one transistor in each half of data high discharge path 72 is turned-off. Accordingly, signal preout_h 51 transitions to a logic low level and signal preout_l 53 remains at a logic high level. Signal preout_h 51 therefore reflects the logical AND functioning of data signals 46a and 46b. Signal preout_l 53 reflects the complementary logic level to signal preout_h 51 or, in other words, the NAND function of data signals 46a and 46b.

Figure 12:
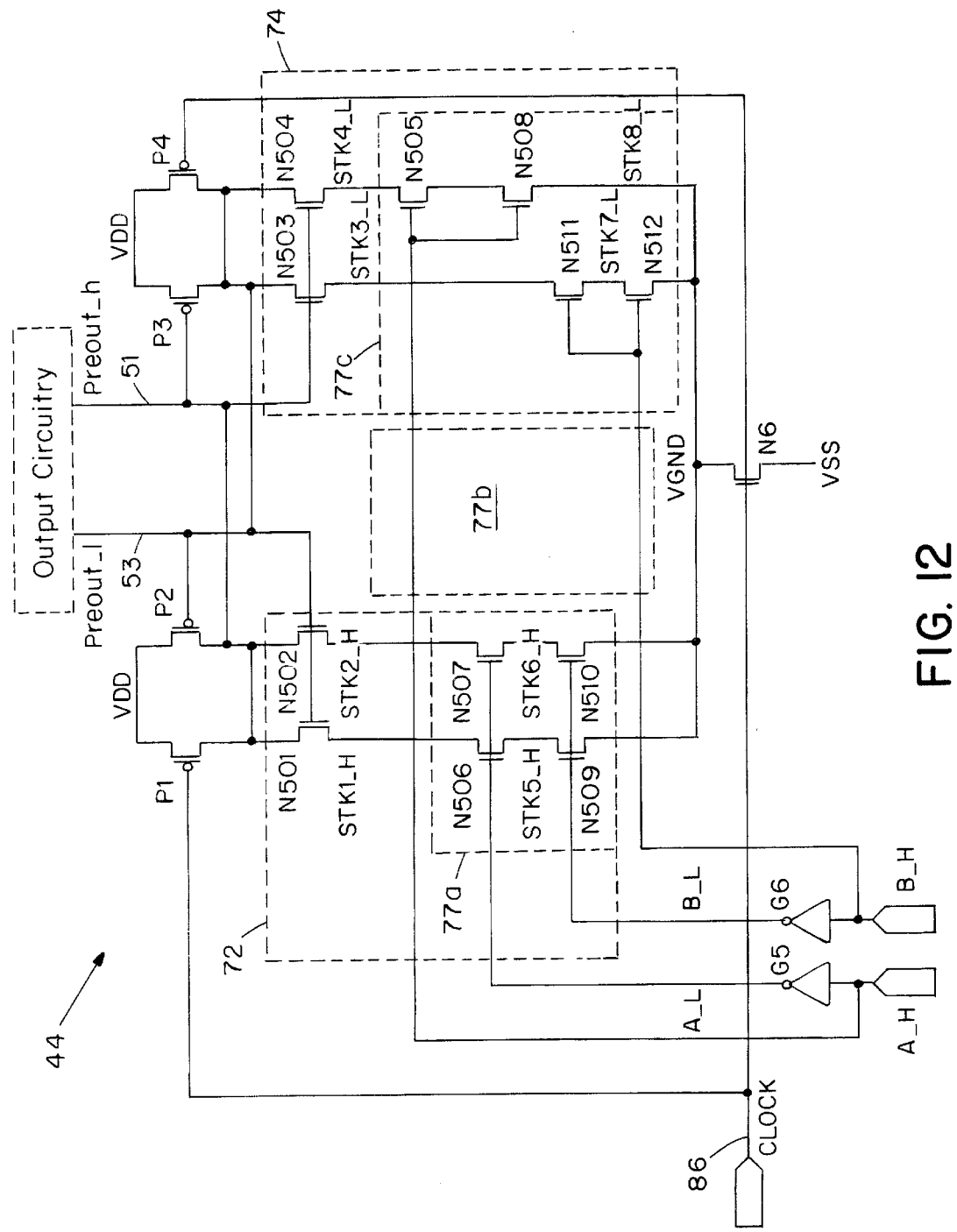
FIG. 12 is a schematic diagram of a further OR/NOR embodiment of the sense amplifier of FIG. 3, according to the present invention.

Referring now to FIG. 12, an alternative embodiment of an OR/NOR latch is shown. Such an OR/NOR latch is similar to the AND/NAND latch of FIG. 11 except that inverters G5 and G6 complement data signals 46a and 46b before, they are conveyed to true logic circuitry 77a. Accordingly, complementing circuitry 77b simply buffers data signals 46a and 46b. Also, signals preout_l 53 and preout_h 51 are swapped such that they discharge through discharge paths 74 and 72, respectively.

True logic circuitry 77a is implemented with two pairs of serially connected transistors N506/N509 and N507/N510. Each of those transistor pairs must be turned-on before signal preout_l 51 can be discharged through data high discharge path 72. More specifically, when data signals 46a and 46b both develop logic low levels, signal preout_h 51 discharges through transistors N501, N502, N506, N507, N509 and N510 and evaluate transistor N6, to Vss. Signal preout_l 53 cannot discharge since transistor pairs N511/N512 and N505/N508 are turned-off in response to data signals 46a and 46b. Accordingly, signal preout_h 51 transitions to a logic low level and signal preout_l 53 remains at a logic high level. Signal preout_h 51 therefore reflects the OR function of data signals 46a and 46b. Signal preout_l 53 reflects the complementary logic level of signal path preout_h 51 or, in other words, the NOR function of data signals 46a and 46b.

Figure 13:
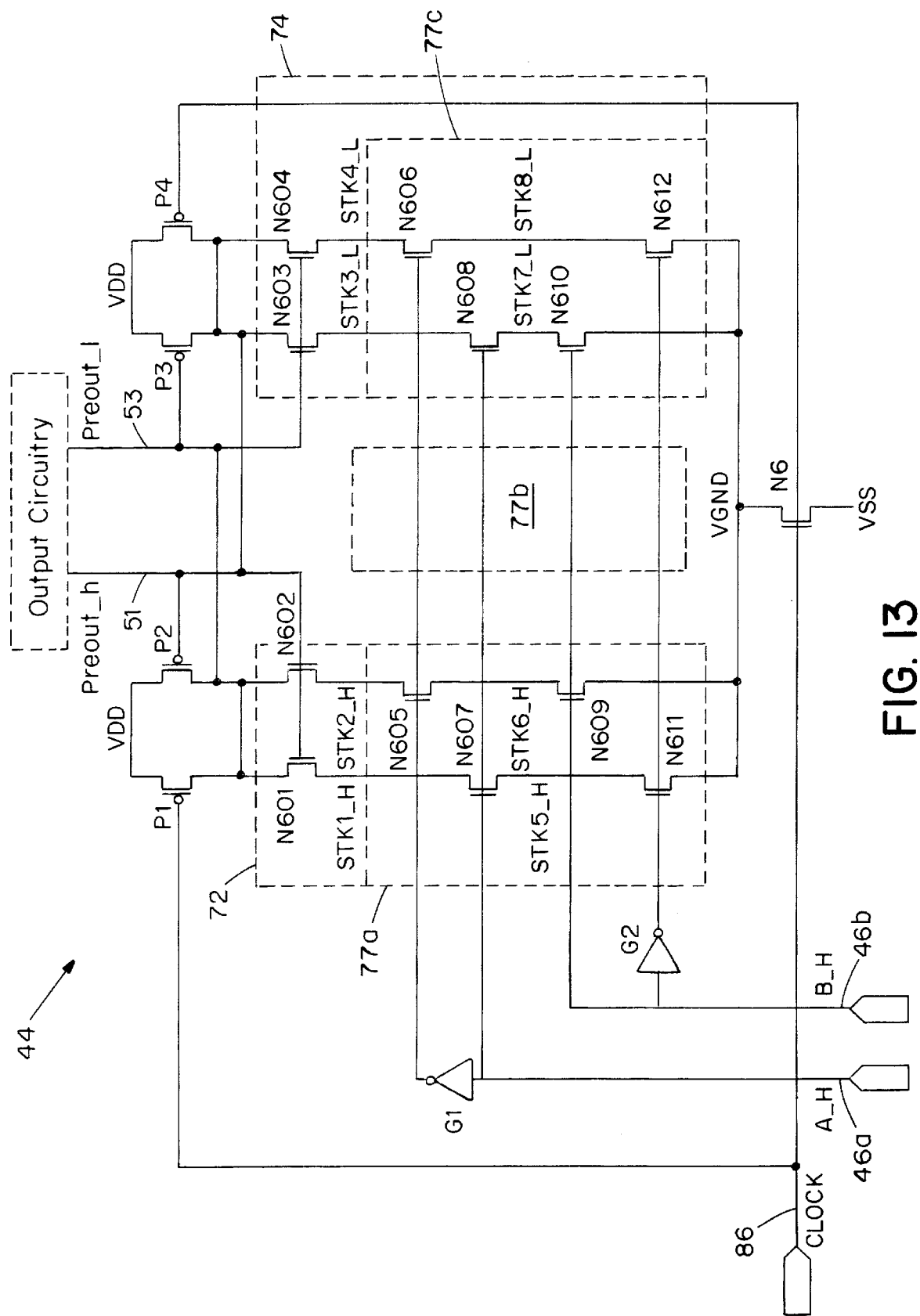
FIG. 13 is a schematic diagram of a XOR/XNOR latch embodiment of the sense amplifier of FIG. 3, according to the present invention.

Referring now to FIG. 13, an alternative embodiment of sense amplifier 44 is shown having an XOR/XNOR latch configuration. In the present embodiment, true logic circuitry 77a implements an XOR function and turns-on the data high discharge path 72 in response to data signals 46a and 46b having complementary logic levels. Complementing circuitry 77b simply buffers true and complement versions of data lines 46a and 46b and conveys them to complementary logic circuitry 77c. Complementary logic circuitry 77c implements an XNOR function and turns-on the data low discharge path 74 in response to data signals 46a and 46b developing equivalent logic levels.

For illustration purposes, consider that data signals 46a and 46b develop logic low and logic high levels, respectively. Transistors N605 and N609, that comprise a portion of data high discharge path 72, are responsively turned-on. Therefore, signal preout_l 53 discharges through transistors N602, N605, N609 and evaluate transistor N6, to Vss. Signal preout_h 51 cannot discharge since transistors N608 and N612 are turned-off in response to data signal 46a and the inverted version of data signal 46b. Accordingly, signal preout_l 51 transitions to a logic low level and signal preout_l 53 remains at a logic high level. Signal preout_h 51 therefore reflects the XOR function of data signals 46a and 46b.

Alternatively, when both of the data signals 46a and 46b are at the same logic level, e.g. a logic high level, transistors N608 and N610 are turned-on. Therefore, signal preout_h 51 discharges to Vss through evaluate transistor N6. Signal preout_l 53 is prevented from discharging since at least one transistor (N605 and N611) in each portion of data high discharge path 72 is turned-off. Signal preout_h 51 therefore reflects the logical XOR function of data signals 46a and 46b. Signal preout_l 53 reflects the complementary logic level of signal preout_h 51 or, in other words, the XNOR function of data signals 46a and 46b.

Figure 14:
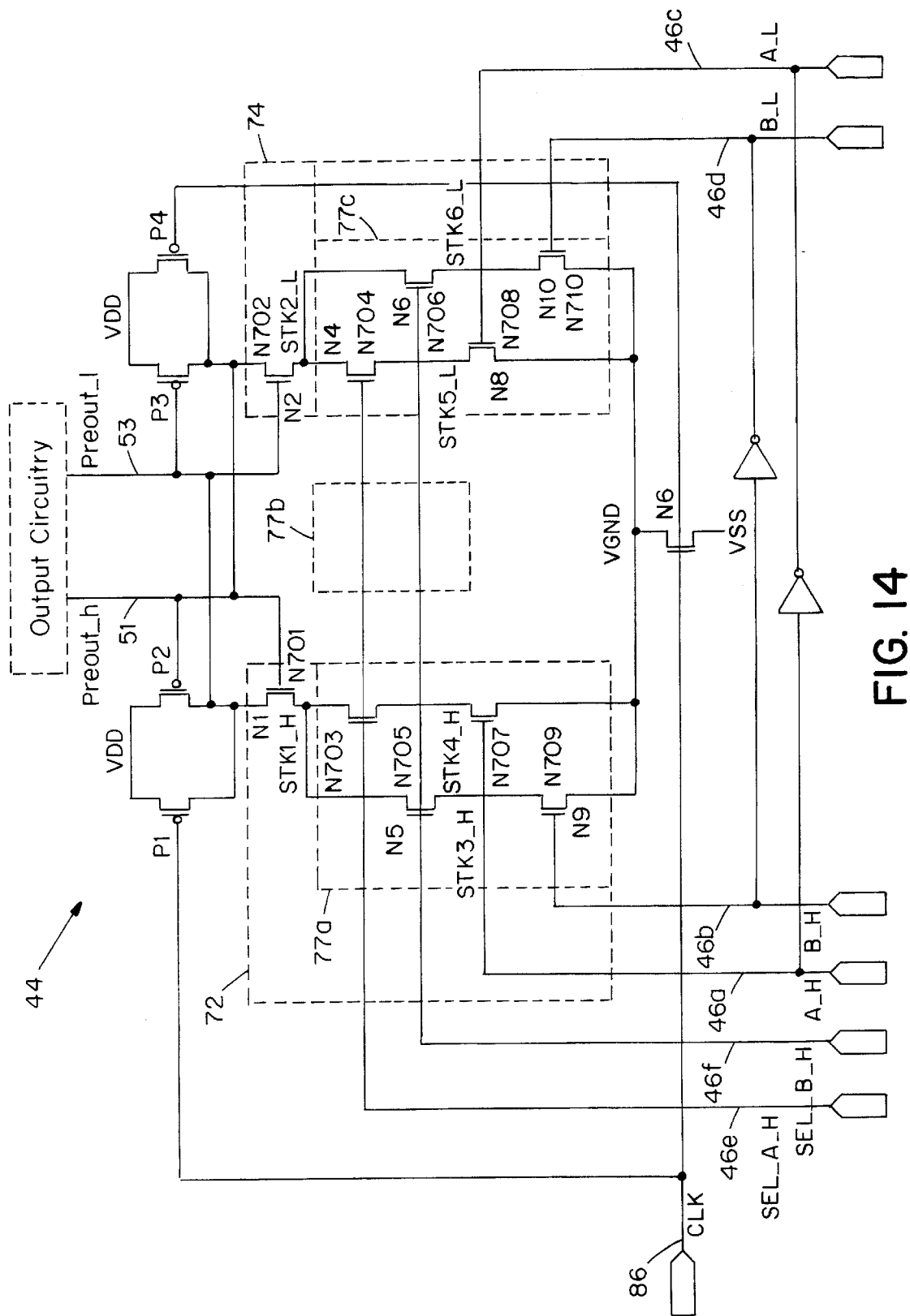
FIG. 14 is a schematic diagram of a MUX latch embodiment of the sense amplifier of FIG. 3, according to the present invention.

Referring now to FIG. 14, sense amplifier 44 is shown to include Multiplexer (MUX) functionality that is imposed on data signals 46a–46d. With such an embodiment, the propagation delay that would otherwise be imposed on data signals 46a–46d by a multiplexer that was external to the sense amplifier is avoided. Therefore, the data set-up timing requirement is significantly reduced.

True logic circuitry 77a includes two electrical paths through which signal preout_h can discharge. The first path is composed of transistors N703 and N707. That path is turned on when a selection signal (SEL_A) and data signal 46a develop logic high levels. Accordingly, when signal SEL_A is asserted and evaluate transistor N6 is turned-on, signal preout_h 51 will develop a voltage that corresponds to the logic level of data signal 46a. Also, because the transistor configuration of true logic circuitry 77a is mirrored in complementary logic circuitry 77c, signal preout_l 53 will also develop a voltage that is the complement to the logic level of data signal 46a.

Likewise, the second path through data high discharge path 72 is composed of transistors N705 and N709. That path is turned on when another selection signal (SEL_B) and data signal 46b develop logic high levels. Accordingly, when signal SEL_B is asserted and evaluate transistor N706 is turned-on, signal preout_h 51 will develop a voltage that corresponds to the logic level of data signal 46b. Also, signal preout_l 53 will develop a voltage that is the complement to the logic level of data signal 46b.

In summary, several embodiments of the present invention have been shown to incorporate logic functions such as AND, OR, XOR and MUX into the discharge paths of a sense amplifier. In that manner, the effective data set-up timing requirements of the sense amplifier are improved thereby allowing data signals 46 to be presented to the sense amplifier at a faster rate and hence improving its performance.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A method for imposing a logic function on a plurality of data signals and latching a result of the logic function, the method comprising the steps of:

providing said plurality of data signals to a sense amplifier;

discharging a first internal signal of said sense amplifier through a first discharge path when a first logic circuit, that comprises a portion of said first discharge path, is asserted to impose a first logic function on said plurality of data signals in response to said plurality of data signals developing a first arrangement of logic levels;

generating a representation of said plurality of data signals; and discharging a second internal signal of said sense amplifier through a second discharge path when a second logic circuit, that comprises a portion of said second discharge path, is asserted to impose a second logic function on said representation of said plurality of data signals in response to said representation of said plurality of data signals.

2. A method for imposing a logic function on a plurality of data signals and latching a result of the logic function, as described in claim 1, further comprising the steps of:

buffering said plurality of data signals in order to generate said representation of said plurality of data signals; and conveying said representation of said plurality of data signals to said second logic function.

3. A method for latching a result of a logic function, as described in claim 2, wherein said second logic function is a logical inversion of said first logic function such that said second logic function is asserted when said first logic function is de-asserted.

4. A method for latching a result of a logic function, as described in claim 3, wherein said first logic function imposes a logical AND function on said plurality of data signals and said second logic function imposes a logical NAND function on said representation of said plurality of data signals.

5. A method for latching a result of a logic function, as described in claim 3, wherein said first logic function imposes a logical OR function on said plurality of data signals and said second logic function imposes a logical NOR function on said representation of said plurality of data signals.

6. A method for latching a result of a logic function, as described in claim 3, wherein said first logic function imposes a logical XOR function on said plurality of data signals and said second logic function imposes a logical XNOR function on said representation of said plurality of data signals.

7. A method for imposing a logic function on a plurality of data signals and latching a result of the logic function, as described in claim 1, further comprising the steps of:

imposing a third logic function on said plurality of data signals to generate said representation of said plurality of data signals, wherein said third logic function is a logical inversion of said first logic function such that said third logic function is asserted when said first logic function is de-asserted; and conveying said representation to said second logic function.

8. A method for latching by a sense amplifier, as described in claim 7, wherein said second logic function is asserted in response to said representation of said plurality of data signals being an assertion of said third logic function.

9. A method for latching by a sense amplifier, as described in claim 8, wherein said first logic function imposes a logical AND function on said plurality of data signals and said third logic function imposes a logical NAND function on said plurality of data signals.

10. A method for latching by a sense amplifier, as described in claim 9, wherein said first logic function imposes a logical OR function on said plurality of data signals and said third logic function imposes a logical NOR function on said plurality of data signals.

11. A method for latching by a sense amplifier, as described in claim 8, wherein said first logic function imposes a logical XOR function on said plurality of data signals and said third logic function imposes a logical XNOR function on said plurality of data signals.

12. A method for imposing a logic function on a plurality of data signals and latching a result of the logic function, as described in claim 3, further comprising the steps of:
    imposing a third logic function on said plurality of data signals to generate said representation of said plurality of data signals, wherein said representation of said plurality of data signals generated by said third logic function is a logical inversion of said plurality of data signals; and
    conveying said representation to said second logic function.

13. A method for internally imposing a logic function on a plurality of data signals and latching a result of the logic function, as described in claim 12 wherein the combination of said second logic function and said third logic function implements a logical inversion of said first logic function such that the combination of said second logic and said third logic function is asserted when said first logic function is de-asserted.

14. A method for internally imposing a logic function on a plurality of data signals and latching a result of the logic function, as described in claim 13, wherein said first logic function imposes a logical AND function on said plurality of data signals and said combination of said second and third logic functions imposes a logical NAND function on said plurality of data signals.

15. A method for internally imposing a logic function on a plurality of data signals and latching a result of the logic function, as described in claim 13, wherein said first logic function imposes a logical OR function on said plurality of data signals and said combination of said second and third logic functions imposes a logical NOR function on said plurality of data signals.

16. A method for internally imposing a logic function on a plurality of data signals and latching a result of the logic function, as described in claim 13, wherein said first logic function imposes a logical XOR function on said plurality of data signals and said combination of said second and third logic functions imposes a logical XNOR function on said plurality of data signals.

17. A method for internally imposing a logic function on a plurality of data signals and
    latching a result of the logic function, as described in claim 2, wherein said first logic function is a multiplexer function and said second logic function is a multiplexer function.

18. A computer system, comprising:
    a central processing unit connected to a memory system by a system bus;
    an I/O system, connected to the system bus by a bus interface device; and at least one sense amplifier, said sense amplifier comprising:
      a first discharge path, coupled to a first internal signal of said sense amplifier, for allowing a charge stored on that first internal signal to be discharged in response to a first logic function being imposed on a number of data signals;
      a true logic circuit, implemented within said first discharge path, for imposing said first logic function on said data signals and for conveying said charge to an evaluate unit when imposing said first logic function results in said true logic circuit providing an electrical path from said first internal signal to an evaluate unit; and
      said evaluate unit, connecting said true logic circuit to an electrical ground, for conveying said charge, stored on said first internal signal, to said electrical ground when said electrical path is provided.

19. The computer system, as described in claim 18, further comprising:
    a second discharge path, coupled to a second internal signal of said sense amplifier, for allowing a charge stored on that second internal signal to be discharged in response to a second logic function being imposed on said data signals;
    a complementary logic circuit, implemented within said second discharge path, for imposing said second logic function on a representation of said data signals, said representation generated by a complementing circuit, and for conveying said charge stored on said second internal signal to said evaluate unit when imposing said second logic function results in said complementary logic circuit providing an electrical path from said second internal signal to said evaluate unit; and
    said evaluate unit further connecting said complementary logic circuit to said electrical ground, for conveying said charge stored on said second internal signal to said electrical ground.

20. The computer system, as described in claim 19, wherein said complementing logic circuit generates said representation of said data signals by imposing a logically inverted version of said first logic function on said data signals, and said second logic function provides said electrical path in response to a predetermined assertion level of said complementary logic circuit.

21. The computer system, as described in claim 20, wherein said first logic function imposes a logical AND function on said data signals and said complementing logic circuit imposes a logical NAND function on said data signals.

22. The computer system, as described in claim 20, wherein said first logic function imposes a logical OR function on said data signals and said complementing logic function imposes a logical NOR function on said data signals.

23. The computer system, as described in claim 20, wherein said first logic function imposes a logical XOR function on said data signals and said second logic function imposes a logical XNOR function on said data signals.

24. The computer system, as described in claim 19, wherein said first logic function is a multiplexer function and said second logic function is a multiplexer function.

25. The computer system, as described in claim 19, wherein said complementing logic circuit generates said representation of said data signals by buffering said data signals and said second logic function provides said electrical path in response to a logical inversion of said first logic function that is imposed on said data signals.

26. The computer system, as described in claim 25, wherein said first logic function imposes a logical AND function on said data signals, and said second logic function imposes a logical NAND function on said representation of said data signals.

27. The computer system, as described in claim 25, wherein said first logic function imposes a logical OR function on said data signals, and said second logic function imposes a logical NOR function on said representation of said data signals.

28. The computer system, as described in claim 25, wherein said first logic function imposes a logical XOR function on said data signals, and said second logic function imposes a logical XNOR function on said representation of said data signals.

29. The computer system, as described in claim 19, wherein said complementing logic circuit generates said representation of said data signals by inverting said data signals and a combination of said complementing logic circuit and said second logic function implements a logical inversion of said first logic function such that said electrical path is provided in response to a predetermined assertion level of said combination.

30. The computer system, as described in claim 29, wherein said first logic function imposes a logical AND function on said data signals and said combinations of said complementing logic circuit and said second logic function imposes a logical NAND function on said data signals.

31. The computer system, as described in claim 29, wherein said first logic function imposes a logical OR function on said data signals and said combinations of said complementing logic circuit and said second logic function imposes a logical NOR function on said data signals.

32. The computer system, as described in claim 29, wherein said first logic function imposes a logical XOR function on said data signals and said combinations of said complementing logic circuit and said second logic function imposes a logical XNOR function on said data signals.

33. The computer system, as described in claim 19, wherein said true logic circuit comprises a plurality of transistors connected such that said charge stored on said first internal signal is conveyed to said evaluate unit via second electrical path in response to said data signals developing logic levels that would cause a positive assertion of said first logic function.

34. The computer system, as described in claim 33, wherein said complementing logic circuit comprises a plurality of transistors connected such that said charge stored on said first internal signal is conveyed to said evaluate unit via said electrical path in response to said data signals developing logic levels that would cause a negative assertion of said first logic function.

35. A sense amplifier having a reduced set-up timing requirement, comprising:
   a first discharge path, coupled to a first internal signal of said sense amplifier, for allowing a charge stored on that first internal signal to be discharged in response to a first logic function being imposed on a number of data signals;
   a true logic circuit, implemented within said first discharge path, for imposing said first logic function on said data signals and for conveying said charge to an evaluate unit when said imposition of said first logic function results in said true logic circuit providing a first electrical path from said first internal signal to an evaluate unit; and
   said evaluate unit, connecting said true logic circuit to an electrical ground, for conveying said charge, stored on said first internal signal, to said electrical ground when said first electrical path is provided.

36. A sense amplifier, as described in claim 35, further comprising:
   a second discharge path, coupled to a second internal signal of said sense amplifier, for allowing a charge stored on that second internal signal to be discharged in response to a second logic function being imposed on said data signals;
   a complementary logic circuit, implemented within said second discharge path, for imposing said second logic function on a representation of said data signals, said representation generated by a complementing circuit, and for conveying said charge stored on said second internal signal to said evaluate unit when said imposition of said second logic function results in said complementary logic circuit providing a second electrical path from said second internal signal to said evaluate unit; and
   said evaluate unit further connecting said complementary logic circuit to said electrical ground, for conveying said charge stored on said second internal signal to said electrical ground.

37. A sense amplifier, as described in claim 36, wherein said complementing logic circuit generates said representation of said data signals by imposing a logically inverted version of said first logic function on said data signals, and said second logic function provides said electrical path in response to a predetermined assertion level of said complementary logic circuit.

38. A sense amplifier, as described in claim 37, wherein said first logic function imposes a logical AND function on said data signals and said complementing logic circuit imposes a logical NAND function on said data signals.

39. A sense amplifier, as described in claim 37, wherein said first logic function imposes a logical OR function on said data signals and said complementing logic function imposes a logical NOR function on said data signals.

40. A sense amplifier, as described in claim 37, wherein said first logic function imposes a logical XOR function on said data signals and said second logic function imposes a logical XNOR function on said data signals.

41. A sense amplifier, as described in claim 36, wherein said complementing logic circuit generates said representation of said data signals by buffering said data signals and said second logic function provides said electrical path in response to a logical inversion of said first logic function that is imposed on said data signals.

42. A sense amplifier, as described in claim 41, wherein said first logic function imposes a logical AND function on said data signals, and said second logic function imposes a logical NAND function on said representation of said data signals.

43. A sense amplifier, as described in claim 41, wherein said first logic function imposes a logical OR function on said data signals, and said second logic function imposes a logical NOR function on said representation of said data signals.

44. A sense amplifier, as described in claim 41, wherein said first logic function imposes a logical XOR function on said data signals, and said second logic function imposes a logical XNOR function on said representation of said data signals.

45. A sense amplifier, as described in claim 36, wherein said complementing logic circuit generates said representation of said data signals by inverting said data signals and a combination of said complementing logic circuit and second logic function implements a logical inversion of said first logic function such that said electrical path is provided in response to a predetermined assertion level of said combination.

46. A sense amplifier, as described in claim 45, wherein said first logic function imposes a logical AND function on said data signals and said combinations of said complementing logic circuit and said second logic function imposes a logical NAND function on said data signals.

47. A sense amplifier, as described in claim 45, wherein said first logic function imposes a logical OR function on said data signals and said combinations of said complementing logic circuit and said second logic function imposes a logical NOR function on said data signals.

48. A sense amplifier, as described in claim 45, wherein said first logic function imposes a logical XOR function on said data signals and said combinations of said complementing logic circuit and said second logic function imposes a logical XNOR function on said data signals.

49. A sense amplifier, as described in claim 36, wherein said true logic circuit comprises a plurality of transistors connected such that said charge stored on said first internal signal is conveyed to said evaluate unit via said first electrical path in response to said data signals developing logic levels that cause a positive assertion of said first logic function.

50. A sense amplifier, as described in claim 45, wherein said complementing logic circuit comprises a plurality of transistors connected such that said charge stored on said first internal signal is conveyed to said evaluate unit via said first electrical path in response to said data signals developing logic levels that cause a negative assertion of said first logic function.

51. A sense amplifier having a reduced data set-up timing requirement, comprising:

means for conveying said data signals to a sense amplifier;

means for discharging a first internal signal of said sense amplifier through a first discharge means when a first logic function, that comprises a portion of said first discharge means, is asserted in response to a plurality of data signals developing a first arrangement of logic levels;

means for generating a representation of said plurality of data signals; and means for discharging a second internal signal of said sense amplifier through a second discharge means when a second logic function, that comprises a portion of said second discharge means, is asserted in response to said representation of said plurality of data signals.

52. A sense amplifier, as described in claim 51, further comprising:

means for buffering said plurality of data signals in order to generate said representation of said plurality of data signals; and means for conveying said representation of said plurality of data signals to said second logic function.

53. A sense amplifier, as described in claim 52, wherein said second logic function is a logical inversion of said first logic function such that said second logic function is asserted when said first logic function is de-asserted.

54. A sense amplifier, as described in claim 51, further comprising:

means for imposing a third logic function on said plurality of data signals in order to generate said representation of said plurality of data signals, wherein said third logic function is a logical inversion of said first logic function such that said third logic function is asserted when said first logic function is de-asserted; and means for conveying said representation to said second logic function.

55. A sense amplifier, as described in claim 54, wherein said second logic function is asserted in response to said representation of said plurality of data signals being an assertion of said third logic function.

* * * * *

UNITED STATES PATENT AND TRADEMARK OFFICE
CERTIFICATE OF CORRECTION

PATENT NO.   : 6,195,377 B1
DATED        : February 27, 2001
INVENTOR(S)  : Shane Lewis Bell and Bruce Alan Gieseke It is certified that error appears in the above-identified patent and that said Letters Patent is hereby corrected as shown below:

Column 1,
Line 24, delete "," after "during".

Column 2,
Line 36, delete "arc" and insert -- are --;
Line 62, delete "arc" and insert -- are --.

Column 5,
Line 17, delete "," after "following";
Line 29, delete "persons" and insert -- performs --;
Line 66, delete "And" and insert -- AND --.

Column 6,
Line 62, delete "arc" and insert -- are --.

Signed and Sealed this

Ninth Day of October, 2001

Attest:

NICHOLAS P. GODICI
Attesting Officer
Acting Director of the United States Patent and Trademark Office